(12) United States Patent
Jeon et al.

(10) Patent No.: US 11,804,447 B2
(45) Date of Patent: Oct. 31, 2023

(54) SEMICONDUCTOR DEVICE HAVING CONDUCTIVE WIRE WITH INCREASED ATTACHMENT ANGLE AND METHOD

(71) Applicant: Amkor Technology Singapore Holding Pte. Ltd., Valley Point (SG)

(72) Inventors: Jun Ho Jeon, Seongdong-gu (KR); Kyeong Sool Seong, Nowon-gu (KR); Seok Ho Na, Nowon-gu (KR); Jeong Il Kim, Jungryang-gu (KR); Young Kyu Kim, Kyunggi-do (KR); Sung Ho Jeon, Gyeonggi-do (KR); Deok In Lim, Gwangju (KR); Sung Moo Hong, Gwangju (KR); Sung Jung Kim, Gwangju (KR); Sung Han Ryu, Gwangju (KR); Kyung Nam Kang, Gwangju (KR); Seong Hak Yoo, Gwangju (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 28 days.

(21) Appl. No.: 17/155,397

(22) Filed: Jan. 22, 2021

(65) Prior Publication Data
US 2021/0143105 A1    May 13, 2021

Related U.S. Application Data

(62) Division of application No. 16/164,733, filed on Oct. 18, 2018, now Pat. No. 10,943,871, which is a
(Continued)

(30) Foreign Application Priority Data
Mar. 10, 2016 (KR) .......................... 10-2016-0028899

(51) Int. Cl.
    *H01L 23/00* (2006.01)
    *H01L 23/552* (2006.01)
    *H01L 21/48* (2006.01)

(52) U.S. Cl.
    CPC ........ *H01L 23/552* (2013.01); *H01L 21/4889* (2013.01); *H01L 24/48* (2013.01);
    (Continued)

(58) Field of Classification Search
    CPC ......... H01L 24/43; H01L 24/48; H01L 24/49; H01L 24/45; H01L 24/46
    See application file for complete search history.

(56) References Cited

U.S. PATENT DOCUMENTS 5,043,534 A    8/1991  Mahulikar
5,444,303 A    8/1995  Greenwood
(Continued)

FOREIGN PATENT DOCUMENTS

JP    02000294979 A    10/2000
JP    02011049243       3/2011
(Continued)

OTHER PUBLICATIONS

Taiwan Search Report for Taiwan Patent Application No. 106101845.

*Primary Examiner* — Michele Fan
(74) *Attorney, Agent, or Firm* — Kevin B. Jackson

(57) ABSTRACT

A semiconductor device includes a shielding wire formed across a semiconductor die and an auxiliary wire supporting the shielding wire, thereby reducing the size of a package while shielding the electromagnetic interference generated from the semiconductor die. In one embodiment, the semiconductor device includes a substrate having at least one circuit device mounted thereon, a semiconductor die spaced apart from the circuit device and mounted on the substrate, a shielding wire spaced apart from the semiconductor die
(Continued)

and formed across the semiconductor die, and an auxiliary wire supporting the shielding wire under the shielding wire and formed to be perpendicular to the shielding wire. In another embodiment, a bump structure is used to support the shielding wire. In a further embodiment, an auxiliary wire includes a bump structure portion and wire portion and both the bump structure portion and the wire portion are used to support the shielding wire.

18 Claims, 10 Drawing Sheets

Related U.S. Application Data division of application No. 15/368,583, filed on Dec. 3, 2016, now Pat. No. 10,141,269.

(52) U.S. Cl.
CPC .............. *H01L 24/49* (2013.01); *H01L 24/85* (2013.01); *H01L 24/45* (2013.01); *H01L 2224/45139* (2013.01); *H01L 2224/45144* (2013.01); *H01L 2224/45147* (2013.01); *H01L 2224/4809* (2013.01); *H01L 2224/4848* (2013.01); *H01L 2224/48091* (2013.01); *H01L 2224/48111* (2013.01); *H01L 2224/48453* (2013.01); *H01L 2224/48465* (2013.01); *H01L 2224/48499* (2013.01); *H01L 2224/48998* (2013.01); *H01L 2224/4917* (2013.01); *H01L 2224/49175* (2013.01); *H01L 2224/73265* (2013.01); *H01L 2224/85986* (2013.01); *H01L 2224/92247* (2013.01); *H01L 2924/1433* (2013.01); *H01L 2924/1434* (2013.01); *H01L 2924/14335* (2013.01); *H01L 2924/19107* (2013.01); *H01L 2924/3025* (2013.01)

(56) References Cited

U.S. PATENT DOCUMENTS

| | | | |
|---|---|---|---|
| 5,557,142 A | 9/1996 | Gilmore | |
| 5,614,694 A | 3/1997 | Gorenz, Jr. | |
| 6,380,634 B1 * | 4/2002 | Umehara | H01L 24/85 |
| | | | 257/784 |
| 6,518,600 B1 | 2/2003 | Shaddock | |
| 6,538,336 B1 | 3/2003 | Seeker | |
| 6,686,649 B1 | 2/2004 | Mathews | |
| 6,853,055 B1 | 2/2005 | Kuang | |
| 7,030,469 B2 | 4/2006 | Mahedevan | |
| 8,012,868 B1 | 9/2011 | Santos Naval | |
| 8,269,320 B2 | 9/2012 | Huang | |
| 8,362,598 B2 | 1/2013 | Park | |
| 8,558,365 B1 | 10/2013 | Roa | |
| 8,729,682 B1 | 5/2014 | Davis | |
| 9,153,543 B1 | 10/2015 | Mangrum | |
| 9,240,372 B1 | 1/2016 | Liou | |
| 9,362,209 B1 | 6/2016 | Mangrum | |
| 2002/0080593 A1 | 6/2002 | Tsuge | |
| 2004/0000726 A1 | 1/2004 | Lee | |
| 2004/0155332 A1 | 8/2004 | Petty-Weeks | |
| 2004/0166763 A1 | 8/2004 | Hanada | |
| 2005/0030661 A1 | 12/2005 | Zhao | |
| 2006/0091523 A1 * | 5/2006 | Shimanuki | H01L 24/32 |
| | | | 257/784 |
| 2007/0030661 A1 | 2/2007 | Morris | |
| 2007/0257348 A1 | 11/2007 | Yang | |
| 2008/0014678 A1 | 1/2008 | Howard | |
| 2008/0170379 A1 | 7/2008 | Basoor | |
| 2008/0286959 A1 | 11/2008 | Chia | |
| 2008/0310114 A1 | 12/2008 | Pawlenko | |
| 2009/0321953 A1 | 12/2009 | Kang | |
| 2010/0147552 A1 | 6/2010 | Qin | |
| 2012/0218729 A1 | 8/2012 | Cary | |
| 2015/0237713 A1 * | 8/2015 | Elsherbini | H01L 25/50 |
| | | | 361/679.55 |
| 2016/0086895 A1 | 3/2016 | Ebisui | |
| 2016/0379953 A1 | 12/2016 | Thompson | |
| 2018/0166363 A1 | 6/2018 | Heppner | |

FOREIGN PATENT DOCUMENTS

| | | | | |
|---|---|---|---|---|
| JP | 2011049243 A | * | 3/2011 | |
| JP | 2012109455 A | * | 6/2012 | ............ H01L 24/05 |

* cited by examiner

SEMICONDUCTOR DEVICE HAVING CONDUCTIVE WIRE WITH INCREASED ATTACHMENT ANGLE AND METHOD

CROSS-REFERENCE TO RELATED APPLICATIONS

The present application is a divisional application of U.S. patent application Ser. No. 16/164,733 filed on Oct. 18, 2018 and issued as U.S. Pat. No. 10,943,871 on Mar. 9, 2021, which is a divisional application of U.S. patent application Ser. No. 15/368,583 filed on Dec. 3, 2016 and issued as U.S. Pat. No. 10,141,269 on Nov. 27, 2018, which claims priority from Korean Patent Application No. 10-2016-0028899, filed on Mar. 10, 2016, and all the benefits accruing therefrom under 35 U.S.C. § 119, the contents of which in their entirety are herein incorporated by reference.

FIELD

Certain embodiments of the disclosure relate to a semiconductor device and a method of making the semiconductor device.

BACKGROUND

Since multiple semiconductor devices manufactured to have various configurations and electronic devices for exchanging various signals are integrated in various electronic devices, it is known that the semiconductor devices and the electronic devices emit electromagnetic interference during the electrical operation of the semiconductor devices and the electronic devices.

The electromagnetic interference may be emitted from the semiconductor devices and the electronic devices mounted on a motherboard at narrow spacings, and neighboring semiconductor devices may be directly or indirectly affected by the electromagnetic interference.

Therefore, in order to partially shield the semiconductor devices, wires or shielding layers may be used. In such a case, however, the use of the wires or the shielding layers may increase sizes of the semiconductor devices.

BRIEF SUMMARY

The present description provides a semiconductor device, which includes a shielding wire formed across the semiconductor die and an auxiliary structure supporting the shielding wire, thereby reducing the size of a semiconductor package while shielding the electromagnetic interference generated from the semiconductor die.

The above and other objects of the present description will be set forth in or be apparent from the following description of several embodiments.

According to an aspect of the present embodiments, there is provided a semiconductor device including a substrate having at least one circuit device mounted thereon, a semiconductor die spaced apart from the circuit device and mounted on the substrate, a shielding wire spaced apart from the semiconductor die and formed across the semiconductor die, and an auxiliary structure supporting the shielding wire under the shielding wire. In some embodiments, the auxiliary structure comprises an auxiliary wire formed to be generally perpendicular to the shielding wire.

According to another aspect of the present embodiments, there is provided a substrate, a semiconductor die mounted adjacent to the substrate, an auxiliary structure connected to the substrate, and a conductive wire connected at a first end to a first part of the substrate and physically contacting the auxiliary structure to increase an angle at which the conductive wire is connected to the substrate. According to another embodiment, a method includes providing a substrate having a semiconductor die connected to a surface of the substrate. The method includes forming an auxiliary structure that is coupled to the substrate and connecting a conductive wire to the substrate, wherein the conductive wire physically contacts the auxiliary structure to increase an angle at which the conductive wire is connected to the substrate.

As described above, according to the present embodiments, since the semiconductor device includes a shielding wire spaced apart from the semiconductor die and formed across the semiconductor die, and an auxiliary structure supporting the shielding wire under the shielding wire, a distance between the semiconductor die and the circuit device can be reduced and the electromagnetic interference generated from the semiconductor die can be shielded, thereby reducing the size of the semiconductor device according to the present invention.

In addition, according to another embodiment, since the semiconductor device includes a conductive wire electrically connecting the semiconductor die and the substrate, and an auxiliary structure supporting the conductive wire under the conductive wire, the size of the semiconductor device can be reduced.

Furthermore, according to another embodiment, the auxiliary structure comprising a bump structure is provided adjacent the conductive wire to facilitate the conductive wire having a steeper slope angle. In a further embodiment, the auxiliary structure comprises a bump structure portion and a wire portion, and the bump structure portion and the wire portion are both used to facilitate a bond wire with an even steeper slope angle.

DETAILED DESCRIPTION OF THE DRAWINGS

Figure 1:
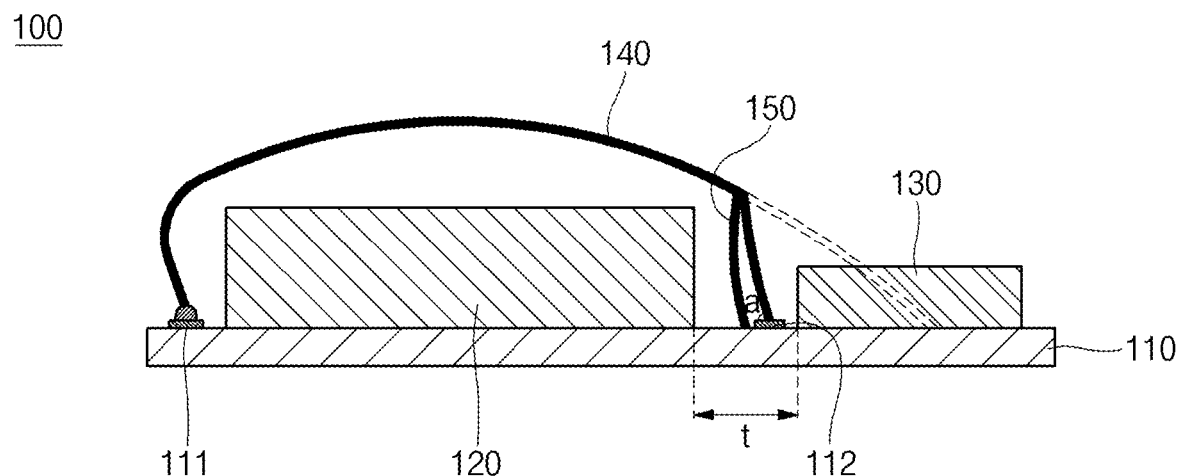
FIG. 1 is a cross-sectional view of a semiconductor device according to an embodiment of the present invention.

Hereinafter, examples of various embodiments will be described in detail with reference to the accompanying drawings such that they can be made and used by those skilled in the art.

Various aspects of the present disclosure may be embodied in many different forms and should not be construed as being limited to the example embodiments set forth herein. Rather, these example embodiments of the disclosure are provided so that this disclosure will be thorough and complete and will convey various aspects of the disclosure to those skilled in the art.

In the drawings, the thickness of layers and regions may be exaggerated for clarity. Here, like reference numerals refer to like elements throughout. As used herein, the term "and/or" includes any and all combinations of one or more of the associated listed items. In addition, it will be understood that when an element A is referred to as being "connected to" an element B, the element A can be directly connected to the element B, or an intervening element C may be present between the elements A and B so that the element A can be indirectly connected to the element B.

In addition, the terminology used herein is for the purpose of describing particular embodiments only and is not intended to be limiting of the disclosure. As used herein, the singular forms are intended to include the plural forms as well, unless the context clearly indicates otherwise. It will be further understood that the terms "comprises, includes," and/or "comprising, including," when used in this specification, specify the presence of stated features, numbers, steps, operations, elements, and/or components, but do not preclude the presence or addition of one or more other features, numbers, steps, operations, elements, components, and/or groups thereof.

It will be understood that, although the terms first, second, etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure. Unless specified otherwise, as used herein the word over or on includes orientations, placements, or relations where the specified elements can be in direct or indirect physical contact. Unless specified otherwise, as used herein the word overlapping includes orientations, placements, or relations where the specified elements can at least partly or wholly coincide or align in the same or different planes. It is further understood that the embodiments illustrated and described hereinafter suitably may have embodiments and/or may be practiced in the absence of any element that is not specifically disclosed herein.

Figure 2:
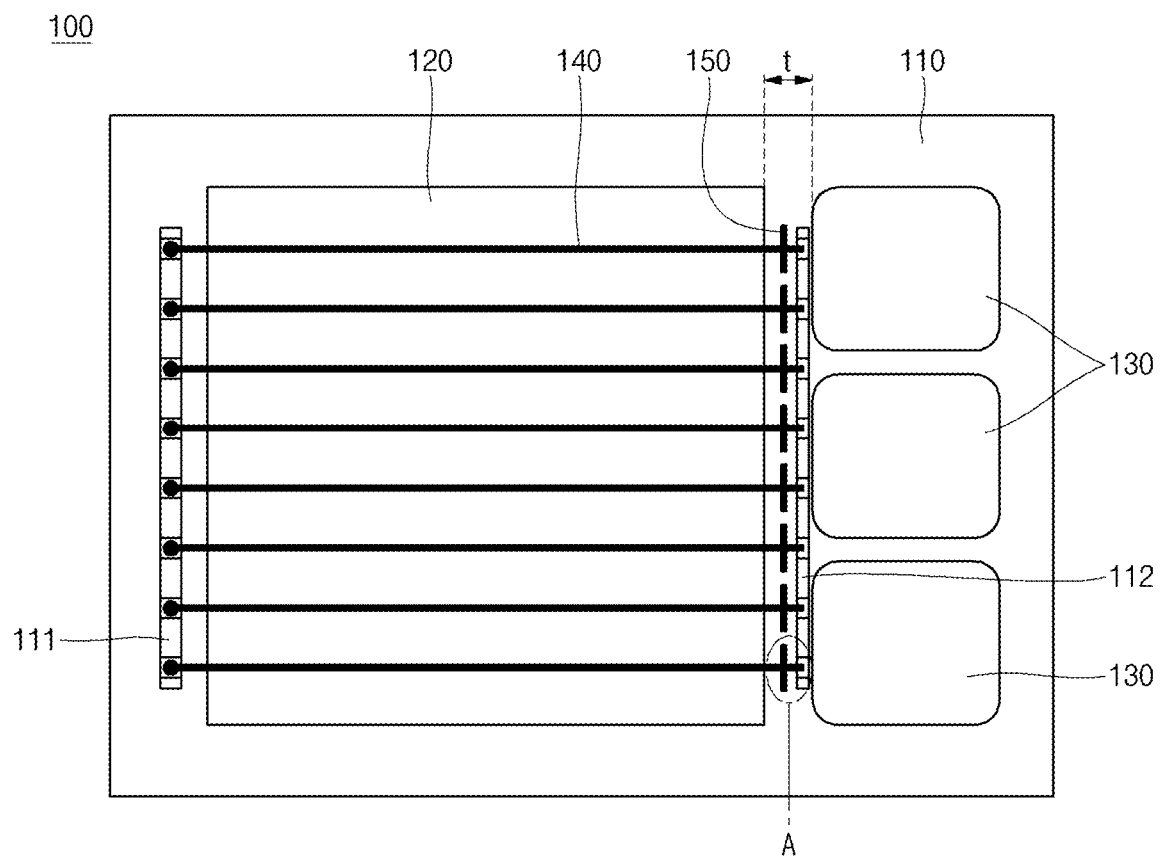
FIG. 2 is a plan view of the semiconductor device illustrated in FIG. 1.
Figure 3A:
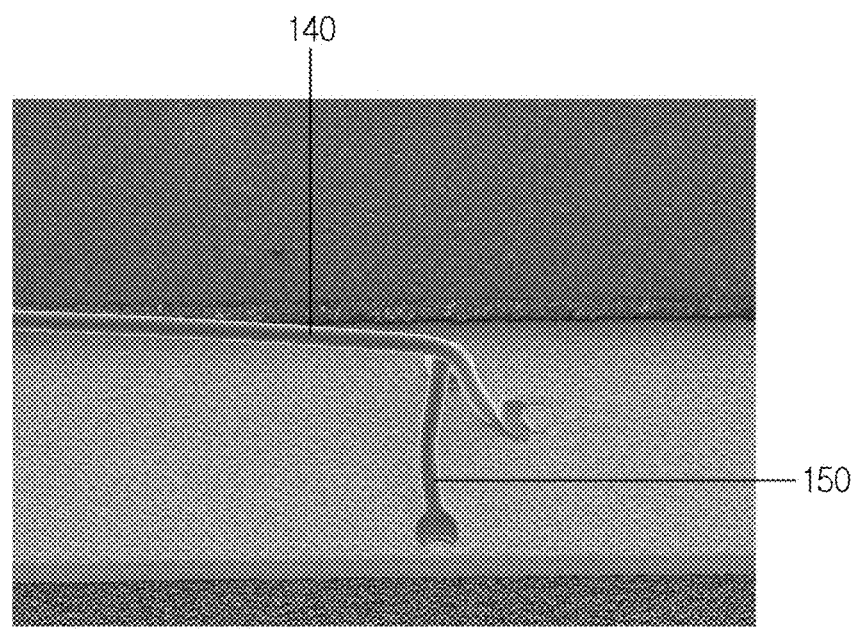
FIGS. 3A and 3B are photographs of a portion 'A' of FIG. 2.
Figure 3B:
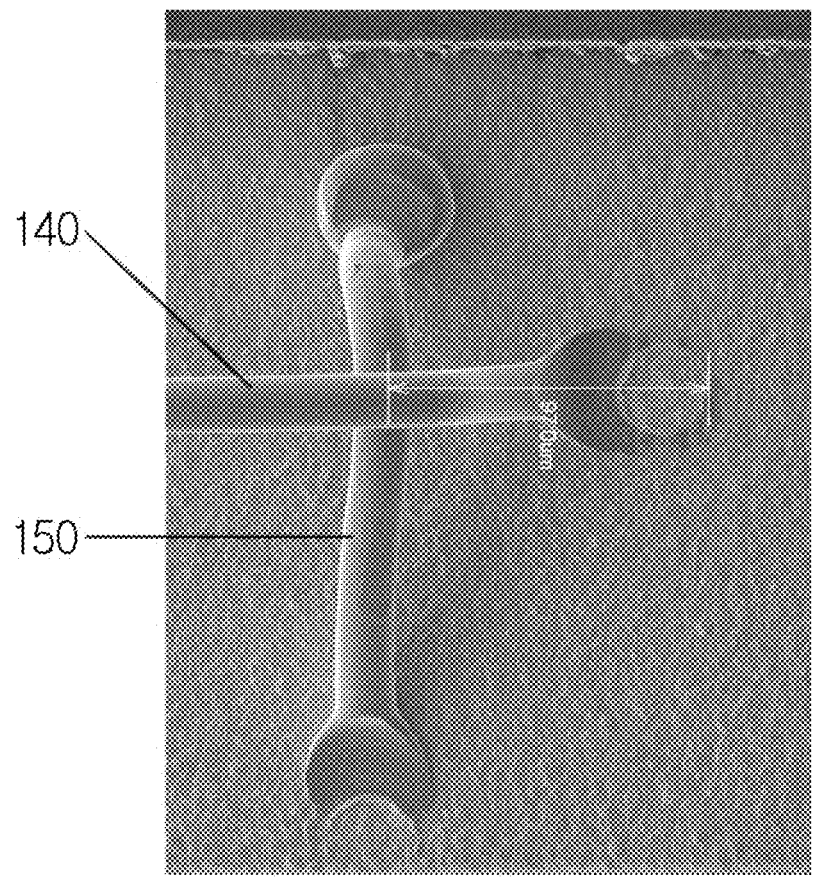
Figure 4:
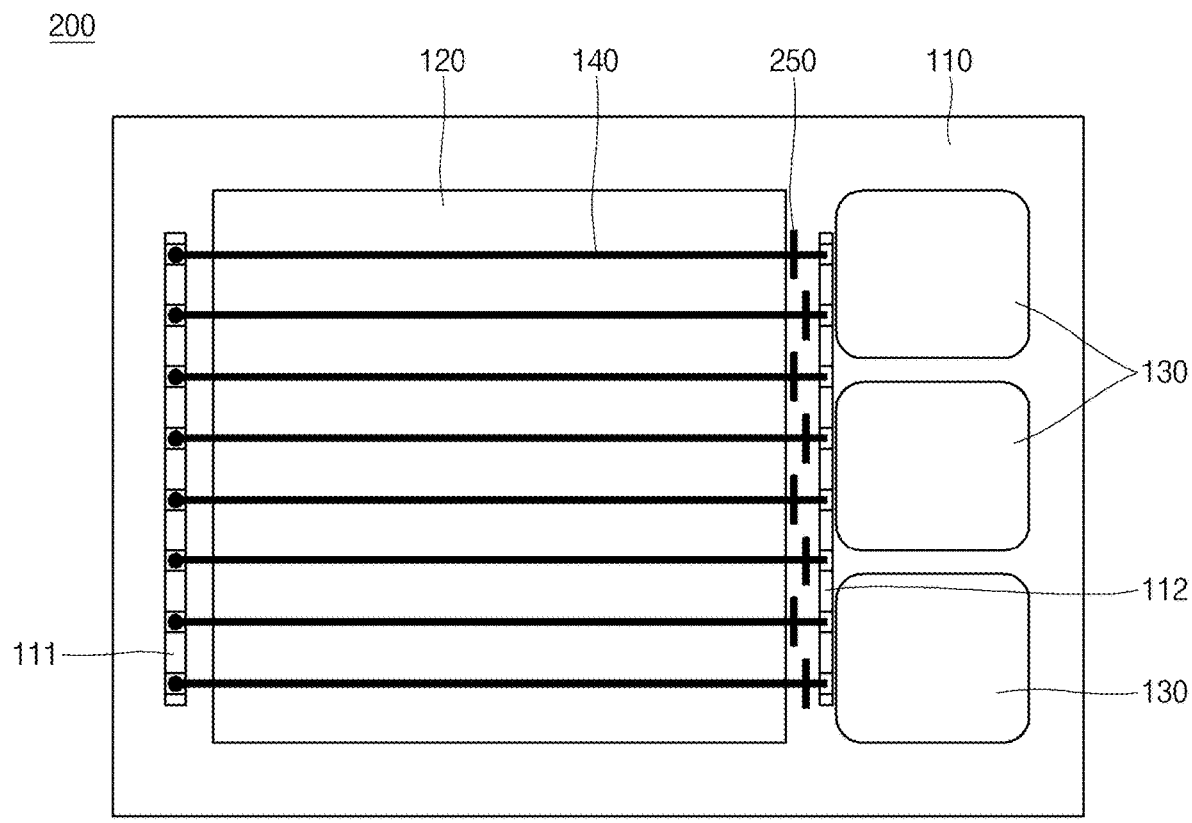
FIG. 4 is a plan view of a semiconductor device according to another embodiment of the present invention.

FIG. 1 is a cross-sectional view of a semiconductor device 100 according to one embodiment, FIG. 2 is a plan view of the semiconductor device illustrated in FIG. 1, FIGS. 3A and 3B are captured photographs of a portion 'A' of FIG. 2, and FIG. 4 is a plan view of semiconductor device 100 according to another embodiment.

Referring to FIGS. 1 and 2, the semiconductor device 100 according to an embodiment includes a substrate 110, a semiconductor die 120, a circuit device 130, a shielding wire 140 or shielding wire structure 140, and an auxiliary structure, such as an auxiliary wire 150.

In one embodiment, the semiconductor die 120 is mounted adjacent to or on the substrate 110. The substrate 110 may be, for example, a printed circuit board (PCB) including an insulating layer and a plurality of circuit patterns formed on a surface of and/or within the insulating layer. In addition, the substrate 110 may be one selected from the group consisting of a rigid printed circuit board, a flexible printed circuit board, a ceramic circuit board, an interposer, and similar structures as known to those skilled in the art. The rigid printed circuit board typically includes a phenol resin or an epoxy resin as a base material, and may have a plurality of circuit patterns formed on or adjacent to the surface of and/or within rigid printed circuit board. The flexible printed circuit board typically includes a polyimide resin as a base material and may have a plurality of circuit patterns formed on the surface of and/or within the flexible printed circuit board. The ceramic circuit board typically includes a ceramic as a base material and may have a plurality of circuit patterns formed on or adjacent to the surface of and/or within the ceramic circuit board. The interposer may be a silicon based interposer or a dielectric based interposer. Additionally, various kinds of substrates may be used in the present embodiments, but the present description does not particularly limit the kind of the substrate 110.

In some embodiments, the semiconductor die 120 is mounted on or adjacent to the substrate 110. The semiconductor die 120 may be electrically connected to the substrate 110 through a conductive bump (not shown) or other connective structures as known to those skilled in the art. The semiconductor die 120 may be electrically connected to the circuit pattern of the substrate 110 through, for example, a mass reflow process, a thermal compression process or a laser bonding process. The semiconductor die 120 may have features of various types of semiconductor dies. The semiconductor die 120 may include, for example, a processor die, a memory die, an application specific integrated circuit die, a general logic die, active semiconductor components, and other electronic devices as known to those skilled in the art. In some embodiments, the conductive bump of the semiconductor die 120 may include, for example, a conductive ball, such as a solder ball, a conductive pillar, such as a copper pillar, and/or a conductive post having a solder cap formed on a copper pillar.

In some embodiments, the circuit device 130 is mounted on or adjacent to the substrate 110 and is positioned in the vicinity of or proximate to the semiconductor die 120. The circuit device 130 may be, for example, a passive device, an active device and/or a semiconductor die. The circuit device 130 may include a plurality of circuit devices formed in vicinity of the semiconductor die 120. The circuit device 130 may be electrically connected to the circuit pattern of the substrate 110 through, for example, a mass reflow process, a thermal compression process or a laser bonding process.

In accordance with the present embodiment, the shielding wire 140 is spaced apart from the semiconductor die 120 and is formed to surround the semiconductor die 120. The shielding wire 140 may be configured to shield the electromagnetic interference generated from the semiconductor die 120 so as not to be emitted to the outside or may prevent external electromagnetic interference from penetrating into the semiconductor die 120. In addition, the shielding wire 140 functions to prevent electromagnetic interference from occurring between the semiconductor die 120 and the circuit device 130 of the semiconductor device 100. Therefore, the shielding wire 140 may include a plurality of shielding wires and may surround the semiconductor die 120. Here, as the number of the shielding wires 140 increases, EMI shielding performance can be improved.

In accordance with the present embodiment, one end of the shielding wire 140 is bonded to the substrate 110 positioned at one side of the semiconductor die 120 and the other or opposite end of the shielding wire 140 is bonded to the substrate 110 positioned at the other side of the semiconductor die 120. More particularly, the shielding wire 140 is spaced apart from the semiconductor die 120 and is formed across so as to overlap the semiconductor die 120. In some embodiments, the shielding wire 140 may be bonded or attached to bonding pads 111 and 112 formed on the substrate 110. The bonding pad positioned at one side of the semiconductor die 120 can be referred to as a first bonding pad 111 and the bonding pad positioned at the other side of the semiconductor die 120 can be referred to as a second bonding pad 112. More particularly, in some embodiments, one end of the shielding wire 140 is bonded to the first bonding pad 111 and the other end of the shielding wire 140 is then bonded to the second bonding pad 112 across the semiconductor die 120. In accordance with the present embodiment, the shielding wire 140 may be bonded to the second bonding pad 112 while being sharply or steeply angled by the auxiliary wire 150, which will later be described in more detail in describing the auxiliary wire 150.

The second bonding pad 112 is positioned between the semiconductor die 120 and the circuit device 130. In one embodiment, the first and second bonding pads 111 and 112 may be electrically connected to the ground of the substrate 110. Therefore, the shielding wire 140 bonded to the first and second bonding pads 111 and 112 may also be electrically connected to the ground of the substrate 110. While the first bonding pad 111 formed as a single unit is illustrated in FIG. 2, it may consist of a plurality of units formed to be spaced apart or laterally separated from each other so as to correspond to the plurality of shielding wires 140, respectively. Likewise, while the second bonding pad 112 formed as a single unit is illustrated in FIG. 2, it may consist of a plurality of units formed to be spaced apart or laterally separated from each other so as to correspond to the plurality of shielding wires 140, respectively. However, since the first and second bonding pads 111 and 112 are connected to the ground, each of the first and second bonding pads 111 and 112 is more preferably formed as a single unit. The shielding wire 140 may be made of gold (Au), silver (Ag), copper (Cu) and/or other materials as known to those skilled in the art. In addition, in some embodiments, the shielding wire 140 may be formed by additionally coating an insulating material on the aforementioned metal forming the shielding wire 140. Accordingly, the shielding wire 140 may be prevented from being shorted to elements provided in the semiconductor device 100. Here, the insulating material coated on the shielding wire 140 may be made of, for example, one selected from the group consisting of polypropylene, polyethylene, polyimide, polycarbonate and/or equivalents thereof, but aspects of the present disclosure are not limited thereto.

In accordance with the present embodiment, the auxiliary wire 150 is positioned under the shielding wire 140 and is formed to intersect the shielding wire 140. In some embodiments, the auxiliary wire 150 is positioned to be generally perpendicular to the shielding wire 140 and is formed in vicinity of the second bonding pad 112. More particularly, the auxiliary wire 150 is positioned between the semiconductor die 120 and the second bonding pad 112. In addition, since the auxiliary wire 150 is formed in each of the plurality of shielding wires 140, the auxiliary wire 150 may be arranged in a line to be generally parallel with each other. In some embodiments, the auxiliary wire 150 has a smaller width than the shielding wire 140 and is formed in the shape of an arch. In addition, in other embodiments, the auxiliary wire 150 may have a thickness equal to or greater than that of the shielding wire 140. However, since the auxiliary wire 150 needs to support the shielding wire 140, it is more preferable for the auxiliary wire 150 to be thicker than the shielding wire 140.

In accordance with the present embodiment, the auxiliary wire 150 supports the shielding wire 140 and increases an angle at which the shielding wire 140 is bonded to the second bonding pad 112. More particularly, as illustrated in FIG. 1, one end of the shielding wire 140 is bonded to the first bonding pad 111 and the other end of the shielding wire 140 is bonded to the second bonding pad 112 across the semiconductor die 120. When no auxiliary wire exists, the shielding wire 140 needs to be bonded to a portion at which dotted lines of FIG. 1 end. For example, when no auxiliary wire is present, a shielding wire may be bonded to a second bonding pad at an angle of approximately 45 degrees. In accordance with the present embodiment, the auxiliary wire 150 is formed under the shielding wire 140, so that the shielding wire 140 is brought into contact with the auxiliary wire 150. Accordingly, an angle (a), at which the shielding wire 140 is bonded to the second bonding pad 112, is rapidly increased or is more steeply sloped. In accordance with the present embodiment, the shielding wire may be bonded or attached to the second bonding pad 112 at an angel greater than 45 degrees. In accordance with the present embodiment, the shielding wire 140 may be bonded to the second bonding pad 112 at an angle in a range of approximately 70 degrees to approximately 90 degrees. Further, in accordance with the present embodiment, as the auxiliary wire 150 supports the shielding wire 140 with an increasing force, that is, as the thickness of the auxiliary wire 150 becomes greater than that of the shielding wire 140, the shielding wire 140 may be bonded to the second bonding pad 112 at an angle of approximately 90 degrees. Therefore, according to the present embodiment, a distance between the semiconductor die 120 and the circuit device 130 can be reduced, thereby reducing the size of the semiconductor device 100. For example, a distance (t) between the semiconductor die 120 and the circuit device 130 may be approximately 100 microns or less. In addition, the auxiliary wire 150 may be made of gold (Au), silver (Ag), copper (Cu) and/or other materials as known to those skilled in the art. In addition, the auxiliary wire 150 may be formed by additionally coating an insulating material on the aforementioned metal forming the auxiliary wire 150. Accordingly, the auxiliary wire 150 may be prevented from being shorted to elements provided in the semiconductor device 100. Here, the insulating material coated on the auxiliary wire 150 may be made of, for example, one selected from the group consisting of polypropylene, polyethylene, polyimide, polycarbonate and/or other materials as known to those skilled in the art.

As illustrated in FIG. 4, the auxiliary wire 250 and an auxiliary wire adjacent thereto may be alternately arranged. More particularly, a first set of (e.g., odd-numbered) auxiliary wires 250 may be arranged to be close to the semiconductor die 120 and a second set of (e.g., even-numbered) auxiliary wires 250 may be arranged to be close to the second bonding pad 112. In accordance with the present embodiment, the shielding wires 140 can be more densely arranged, thereby improving EMI shielding performance of the semiconductor die 120.

As described above, the semiconductor device 100 according to the present embodiment includes the shielding wire 140 spaced apart from the semiconductor die 120 and surrounding the semiconductor die 120; and the auxiliary wire 150 supporting the shielding wire 140 under the shielding wire 140, thereby reducing the distance between the semiconductor die 120 and the circuit device 130 while shielding the electromagnetic interference generated from the semiconductor die 120. Accordingly, the size of the semiconductor device 100 according to the present embodiment can be reduced compared to related devices.

Figure 5:
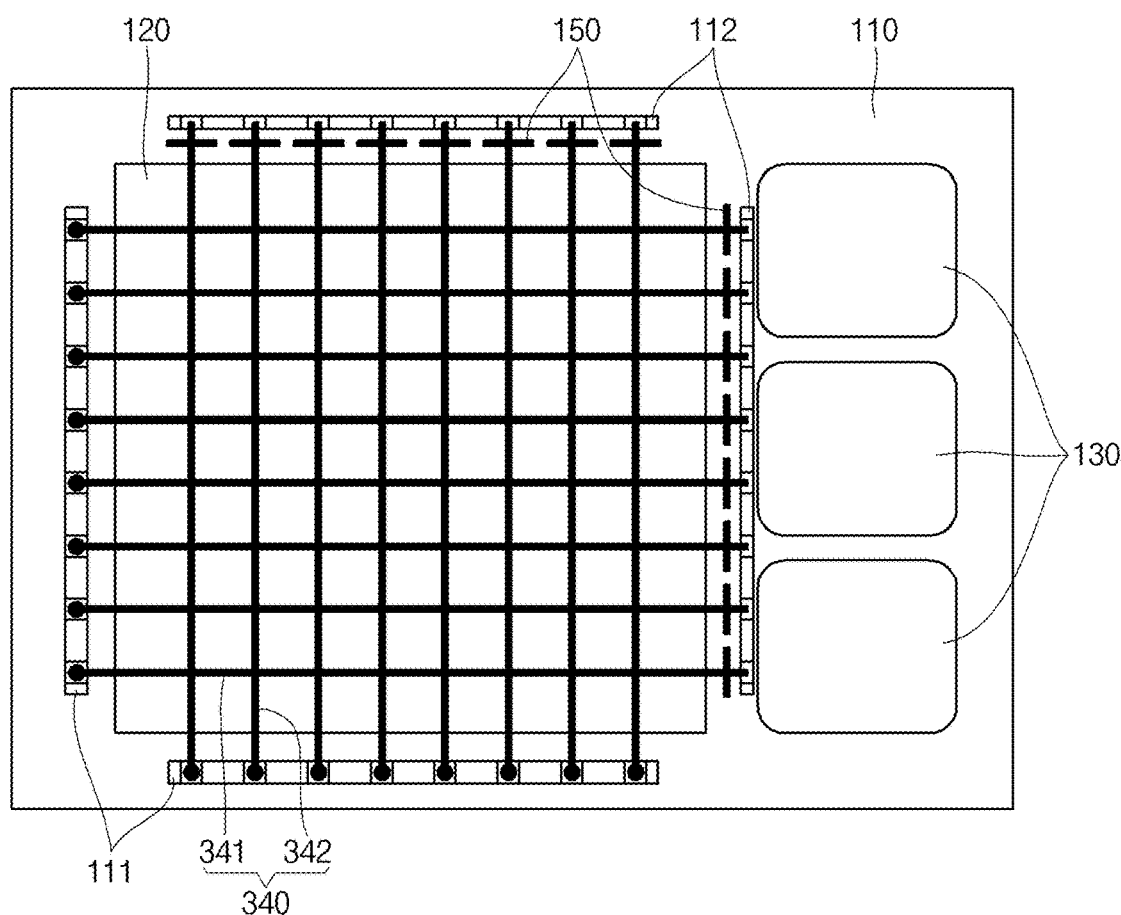
FIG. 5 is a plan view of a semiconductor device according to an embodiment of the present invention.

FIG. 5 is a plan view of a semiconductor device 300 according to still another embodiment. Referring to FIG. 5, in some embodiments, the semiconductor device 300 includes a substrate 110, a semiconductor die 120, a circuit device 130, a shielding wire 340 and an auxiliary structure, such as an auxiliary wire 150. The semiconductor device 300 illustrated in FIG. 5 is substantially the same with the semiconductor device 100 illustrated in FIG. 2 and the following description will focus on differences between the semiconductor device 100 and the semiconductor device 300.

In accordance with the present embodiment, a shielding wire 340 configuration is spaced apart from the semiconductor die 120 and is provided to surround the semiconductor die 120. The shielding wire 340 includes a first shielding wire 341 formed across the semiconductor die 120 from one side to the other side of the semiconductor die 120, and a second shielding wire 342 formed to be generally perpendicular to the first shielding wire 341. More particularly, compared to the semiconductor device 100 illustrated in FIG. 2, the semiconductor device 300 illustrated in FIG. 5 further includes the second shielding wire 342 formed to be generally perpendicular to the first shielding wire 341, which corresponds to the shielding wire 140 of the semiconductor device 100 illustrated in FIG. 2. Accordingly, the semiconductor die 120 of the semiconductor device 300 illustrated in FIG. 5 may demonstrate improved EMI shielding performance, compared to the semiconductor device 100 illustrated in FIG. 2. In accordance with the present embodiment, the first shielding wire 341 and the second shielding wire 342 include a plurality of first shielding wires and a plurality of second shielding wires, respectively. In some embodiments, at the time of forming the second shielding wire 342 after forming the first shielding wire 341, the second shielding wire 342 may be brought into contact with the first shielding wire 341. In addition, the first shielding wire 341 and the second shielding wire 342 can be electrically connected to a ground of the substrate 110. In some embodiments, the shielding wire 340 can be substantially the same as the shielding wire 140 illustrated in FIG. 2 in view of configuration, except that it includes the first shielding wire 341 and the second shielding wire 342 formed to be generally perpendicular to the first shielding wire 341, and the detailed description thereof will not be repeated.

Figure 6A:
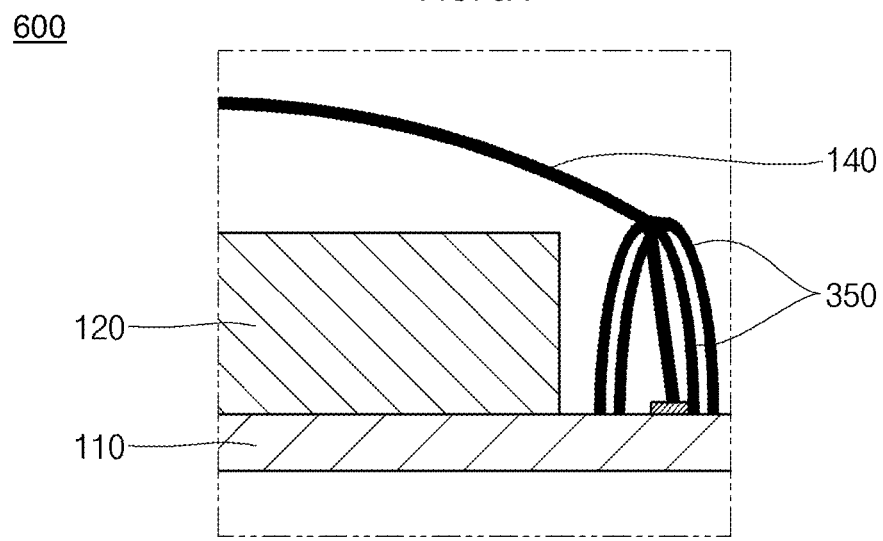
FIG. 6A is a cross-sectional view of a semiconductor device to which an auxiliary wire according to an embodiment of the present invention is applied.
Figure 6B:
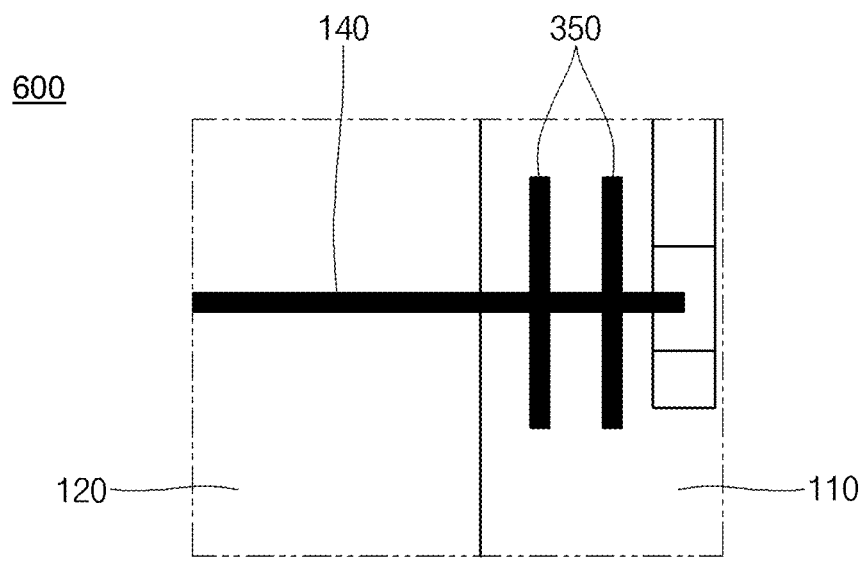
FIGS. 6B and 6C are plan views of the semiconductor device illustrated in FIG. 6A.
Figure 6C:
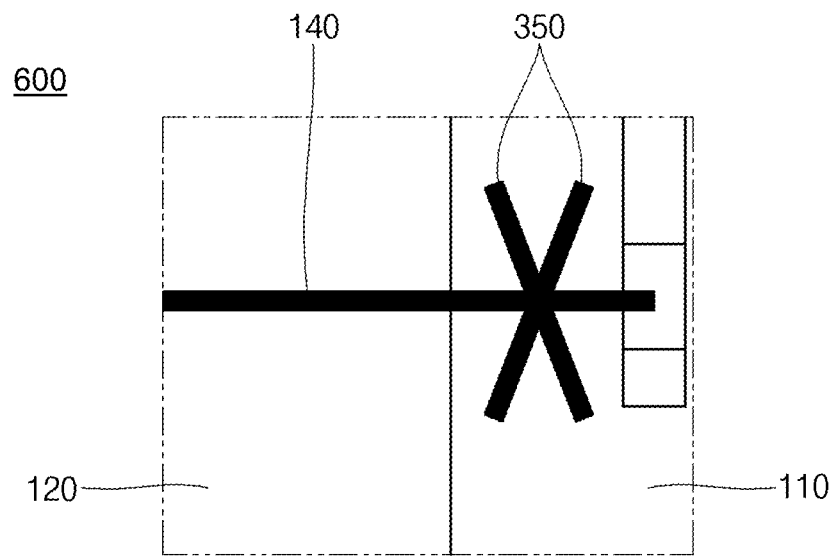

FIG. 6A is a cross-sectional view of a semiconductor device 600 to which an auxiliary structure, such as an auxiliary wire 350 is applied according to another embodiment, and FIGS. 6B and 6C are plan views of the semiconductor device 600 illustrated in FIG. 6A.

Referring to FIG. 6A, the auxiliary wire 350 may include one or more auxiliary wires. For example, as illustrated in FIG. 6A, two auxiliary wires 350 may support one single shielding wire 140. Therefore, the auxiliary wires 350 may more firmly support the shielding wire 140 compared to a case where one single auxiliary wire is used. In accordance with one embodiment, the auxiliary wires 350 may be formed to be generally parallel with each other, as illustrated in FIG. 6B. Alternatively, as illustrated in FIG. 6C, the auxiliary wires 350 may be formed to cross or overlap each other. In addition, while the auxiliary wires 350 including two auxiliary wires are illustrated in FIGS. 6A to 6C, they may include more than two auxiliary wires.

Figure 7A:
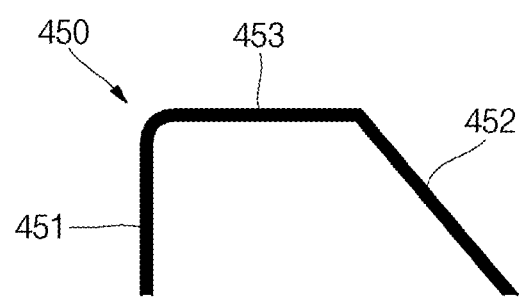
FIG. 7A is a front view of an auxiliary wire according to an embodiment of the present invention.
Figure 7B:
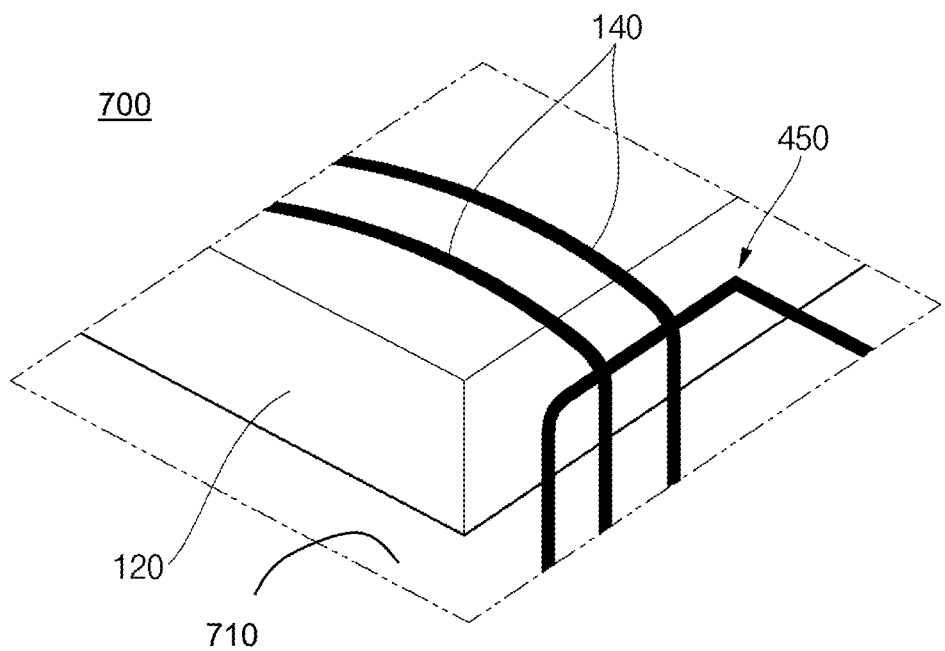
FIG. 7B is a perspective view of a semiconductor device to which the auxiliary wire illustrated in FIG. 7A is applied.

FIG. 7A is a front view of an auxiliary structure, such as an auxiliary wire 450 according to one embodiment, and FIG. 7B is a perspective views of a semiconductor device 700 to which the auxiliary wire 450 illustrated in FIG. 7A is applied.

Referring to FIGS. 7A and 7B, the auxiliary wire 450 includes a first support portion 451, a second support portion 452 formed to be spaced apart from the first support portion 451, and a planar portion 453 connecting the first support portion 451 and the second support portion 452 and formed to be planar. In accordance with the present embodiment, the planar portion 453 is configured to support one or more shielding wires 140. Therefore, the one or more shielding wires 140 may be brought into contact with the planar portion 453 in a planar manner. The first support portion 451 may be formed to be substantially perpendicular to a substrate 710, and the second support portion 452 may be formed to be inclined with respect to the substrate 710.

Figure 8A:
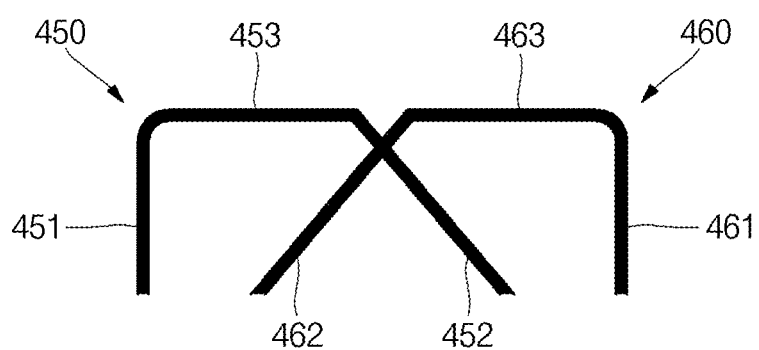
FIG. 8A is a front view of an auxiliary wire according to an embodiment of the present invention.
Figure 8B:
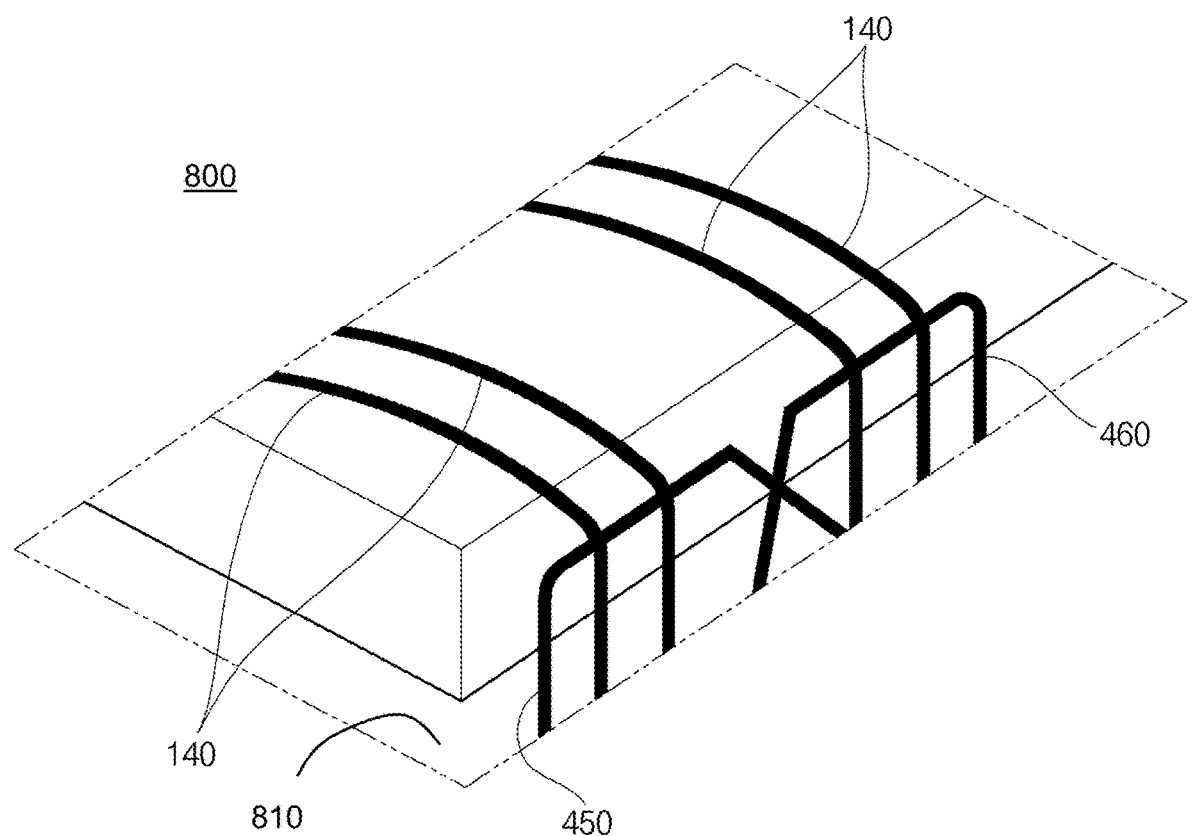
FIG. 8B is a perspective views of a semiconductor device to which the auxiliary wire illustrated in FIG. 8A is applied.

FIG. 8A is a front view of the auxiliary wire 450 according to another embodiment, and FIG. 8B is a perspective views of a semiconductor device 800 to which the auxiliary wire 450 illustrated in FIG. 8A is applied.

Referring to FIGS. 8A and 8B, the auxiliary wire according to still another embodiment of the present invention includes a first auxiliary wire 450 and a second auxiliary wire 460. The first auxiliary wire 450 and the second auxiliary wire 460 are connected to each other and are formed to be symmetrical to each other. Here, the first auxiliary wire 450 is similar to the auxiliary wire 450 illustrated in FIG. 7A.

The first auxiliary wire 450 includes a first support portion 451, a second support portion 452 spaced apart from the first support portion 451, and a planar portion 453 connecting the first support portion 451 and the second support portion 452, which is formed to be planar. In addition, the second auxiliary wire 460 includes a first support portion 461, a second support portion 462 spaced apart from the first support portion 461, and a planar portion 463 connecting the first support portion 461 and the second support portion 462, which is formed to be planar. The first support portion 451, 461 may be formed to be substantially perpendicular to a substrate 810 and the second support portion 452, 462 may be formed to be inclined with respect to the substrate 810. In addition, the first auxiliary wire 450 and the second auxiliary wire 460 may be coupled to each other such that the second support portions 452 and 462 of the first auxiliary wire 450 and the second auxiliary wire 460 are connected to or contact each other. In addition, each of the planar portions 453 and 463 of the first and second auxiliary wires 450 and 460 supports one or more shielding wires 140. Therefore, one or more shielding wires 140 may be brought into contact with each of the planar portions 453 and 463 of the first and second auxiliary wires 450 and 460 in a planar manner. In addition, while two auxiliary wires 450 and 460 intersecting each other are illustrated in FIGS. 8A and 8B, two or more auxiliary wires may be provided. More particularly, the auxiliary wire may include a plurality of auxiliary wires, which may intersect each other and may be arranged, for example, in a line.

Figure 9:
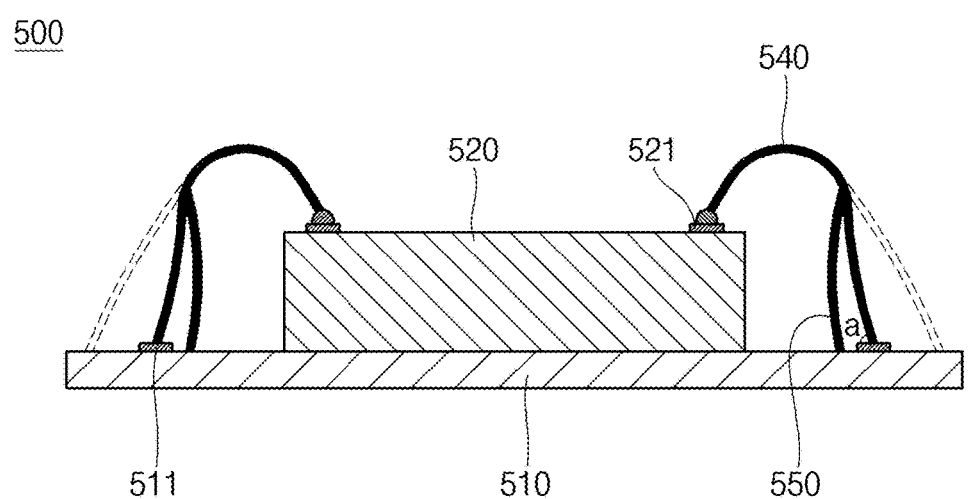
FIG. 9 is a cross-sectional view of a semiconductor device according to an embodiment of the present invention.

FIG. 9 is a cross-sectional view of a semiconductor device 500 according to another embodiment. Referring to FIG. 9, the semiconductor device 500 includes a substrate 510, a semiconductor die 520, a conductive wire 540 and an auxiliary structure, such as an auxiliary wire 550.

In some embodiments, the semiconductor die 520 is mounted on or adjacent the substrate 510. For example, the substrate 510 may be a printed circuit board (PCB) including an insulating layer and a plurality of circuit patterns formed on a surface of and/or within the insulating layer. In addition, the substrate 510 may be one selected from the group consisting of a rigid printed circuit board, a flexible printed circuit board, a ceramic circuit board, an interposer and other structures as known to those skilled in the art. Additionally, various kinds of substrates may be employed in the present embodiment. In the present embodiment, a plurality of bonding pads 511 are formed on or adjacent the substrate 510.

The semiconductor die 520 is mounted on or adjacent the substrate 510. In one embodiment, the semiconductor die 520 may be mounted on the substrate 510 using an adhesion member. The semiconductor die 520 may have features of various types of semiconductor dies. For example, the semiconductor die 520 may include a processor die, a memory die, an application specific integrated circuit die, a general logic die, active semiconductor components, and other electronic devices as known to those skilled in the art. In addition, a plurality of bonding pads 521 are formed on or adjacent a top surface of the semiconductor die 520.

In the present embodiment, a conductive wire 540 electrically connects the semiconductor die 520 to the substrate 510. More particularly, one end of the conductive wire 540 is bonded to the bonding pad 521 of the semiconductor die 520 and the other and opposite end of the conductive wire 540 is bonded to the bonding pad 511 of the substrate 510. Here, the conductive wire 540 may be bonded to the bonding pad 511 of the substrate 510 while being more sharply or steeply angled by the auxiliary wire 550, which will later be described in more detail hereinafter. In some embodiments, the conductive wire 540 may include a plurality of conductive wires. The conductive wire 540 may be made of gold (Au), silver (Ag), copper (Cu) and/or other materials as known to those skilled in the art.

In accordance with the present embodiment, the auxiliary wire 550 is positioned under the conductive wire 540, and is formed to intersect the conductive wire 540. The auxiliary wire 550 is formed to be generally perpendicular to the conductive wire 540 and is positioned between the semiconductor die 520 and the bonding pad 511 of the substrate 510. In addition, since the auxiliary wire 550 is formed under each of the plurality of conductive wires 540, the auxiliary wires 550 may be arranged in a line to be parallel with each other. In some embodiments, the auxiliary wire 550 has a smaller width than the conductive wire 540 and is formed in the shape of an arch. In addition, the auxiliary wire 550 may have a thickness equal to or greater than that of the conductive wire 540. In other embodiments, the auxiliary wire 550 may be thicker than the conductive wire 540.

In accordance with the present embodiment, the auxiliary wire 550 supports the conductive wire 540 and increases the angle at which the conductive wire 540 is bonded to the bonding pad 511 of the substrate 510. More particularly, as illustrated in FIG. 9, one end of the conductive wire 540 is bonded to the bonding pad 521 of the semiconductor die 520 and the other end of the conductive wire 540 is then bonded to the bonding pad 511 of the substrate 510. When no auxiliary wire exists, the conductive wire 540 needs to be bonded to a portion at which dotted lines of FIG. 9 end. For example, when no auxiliary wire exists, a conductive wire may be bonded to a bonding pad of a substrate at an angle of approximately 45 degrees. In the present invention, however, the auxiliary wire 550 is formed under the conductive wire 540, so that the conductive wire 540 is brought into contact with the auxiliary wire 550. Accordingly, an angle (a), at which the conductive wire 540 is bonded to the bonding pad 511 of the substrate 510, is more rapidly or steeply increased. More particularly, the conductive wire 540 may be bonded to the bonding pad 511 of the substrate 510 at an angle in a range of approximately 70 degrees to approximately 90 degrees. In addition, in accordance with the present embodiment, as the auxiliary wire 550 supports the conductive wire 540 with an increasing force, that is, as the thickness of the auxiliary wire 550 becomes greater than that of the conductive wire 540, the conductive wire 540 may be bonded to the bonding pad 511 of the substrate 510 at an angle of approximately 90 degrees. Therefore, according to the present embodiment, a width of the conductive wire 540 connecting the semiconductor die 520 to the substrate 510 can be reduced, thereby reducing the size of the semiconductor device 500. The auxiliary wire 550 may be made of gold (Au), silver (Ag), copper (Cu) and/or other materials as known to those skilled in the art. In addition, the auxiliary wire 550 may be formed by additionally coating an insulating material on the aforementioned metal forming the auxiliary wire 550. Accordingly, the auxiliary wire 550 may be prevented from being shorted to elements provided in the semiconductor device 500. Here, the insulating material coated on the auxiliary wire 550 may be made of, for example, one selected from the group consisting of polypropylene, polyethylene, polyimide, polycarbonate and/or other materials as known to those skilled in the art.

Alternatively, the auxiliary wire 550 may also be formed to have various shapes including, for example, the shapes illustrated in FIGS. 6A to 8B.

Figure 10:
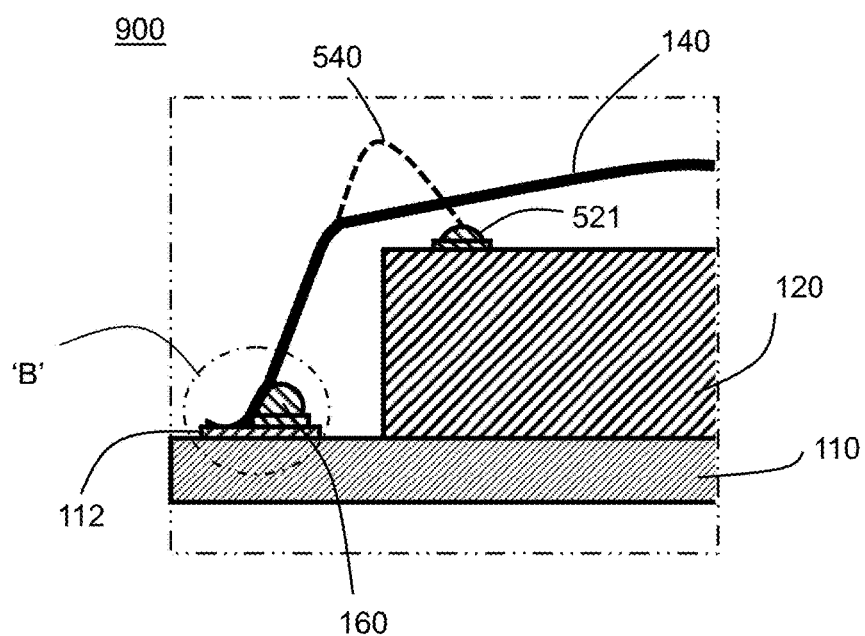
FIG. 10 is a partial cross-sectional view of a semiconductor device according to embodiments of the present invention.
Figure 11:
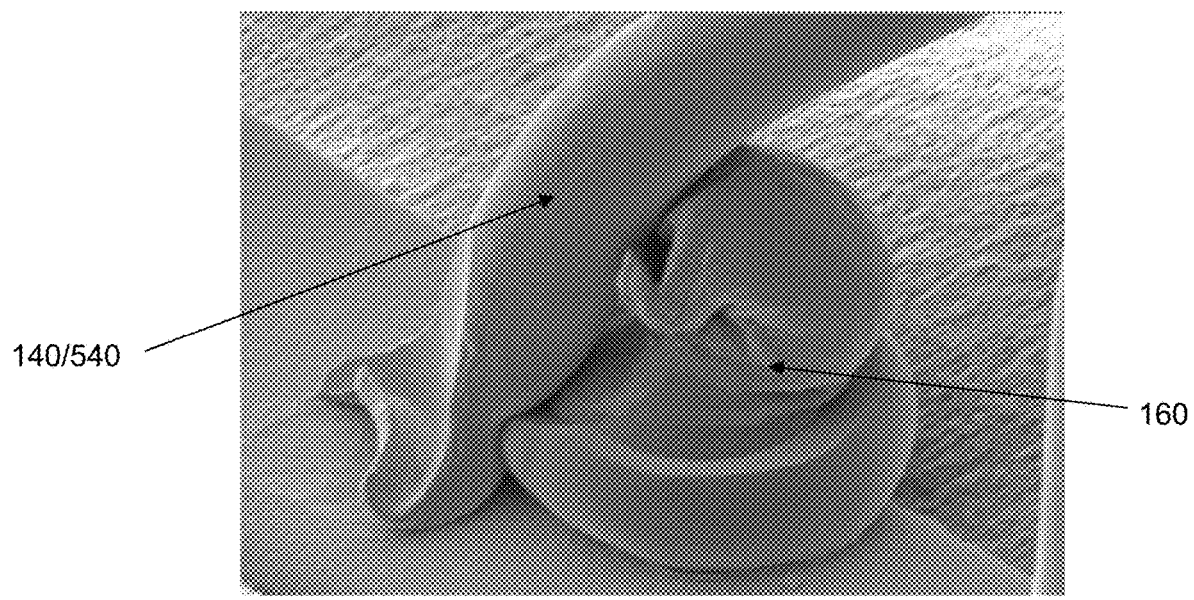
FIG. 11 is a photograph of portion 'B' of FIG. 10.

FIG. 10 illustrates a partial cross-sectional view of a semiconductor device 900 in accordance with a further embodiment, and FIG. 11 is a captured photograph of portion 'B' of FIG. 10. Referring to FIG. 10, the semiconductor device 900 includes the substrate 110, the semiconductor die 120, a conductive wire, such as the shielding wire 140, and an auxiliary structure comprising bump structure 160.

In accordance with the present embodiment, the bump structure 160 is formed adjacent the substrate 110 such that the shielding wire 140 adjoins or is positioned against the bump structure 160 proximate to substrate 110 where the shielding wire 140 is attached to the second bonding pad 112. In one preferred embodiment, a portion of the shielding wire 140 directly contacts the bump structure 160 so that the bump structure 160 supports, provides, or facilitates an angle at which the shielding wire 140 is bonded to the second bonding pad 112 that is rapidly increased or is more steeply sloped compared to related devices. In accordance with the present embodiment, the shielding wire 140 may be bonded to the second bonding pad 112 at an angle greater than approximately 50 degrees. For example, when no bump structure is present, a shielding wire may be bonded to a second bonding pad at an angle of less than approximately 45 degrees.

In some embodiments, the bump structure 160 can be a bump ball formed on the second bonding pad 112 before the shielding wire 140 is provided. The bump structure 160 may be made of gold (Au), silver (Ag), copper (Cu) and/or other materials as known to those skilled in the art, and may be formed using, for example, ball bonding and wire tail removal techniques. In some embodiments, the second bonding pad 112 has a width of approximately 100 microns to accommodate the bump structure 160. It is understood that bump structure 160 may be used in combination with any of the embodiments illustrated herein. For example, shielding wire 140 can instead be a conductive interconnect wire, such as conductive wire 540 having an opposite end attached to the bond pad 521 on semiconductor die 120 as further illustrated in FIG. 10.

As described above, the semiconductor device 900 according to the present embodiment includes the shielding wire 140 spaced apart from the semiconductor die 120 and can surround the semiconductor die 120 as further illustrated, for example, in FIGS. 2, 4, and 5. The bump structure 160 is positioned against a portion of the shielding wire 140, thereby reducing the distance between the semiconductor die 120 and other circuit devices (e.g. the circuit device 130 illustrated in FIG. 1) while shielding the electromagnetic interference generated from the semiconductor die 120. In one embodiment, this distance can be 100 microns or less. Accordingly, the size of the semiconductor device 900 according to the present embodiment can be reduced.

Figure 12:
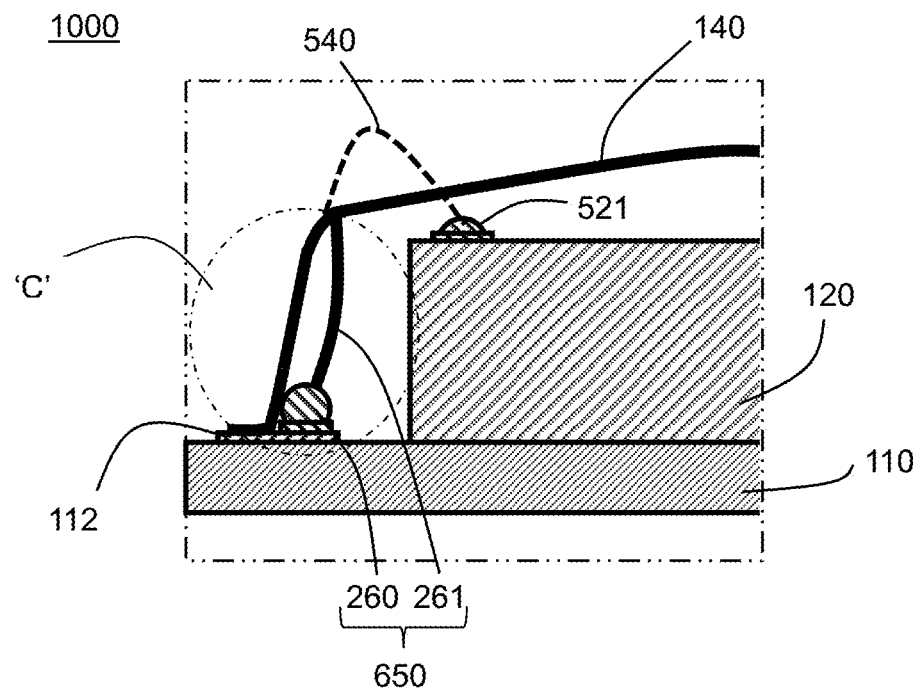
FIG. 12 is a partial cross-sectional view of a semiconductor device according to embodiments of the present invention.
Figure 13:
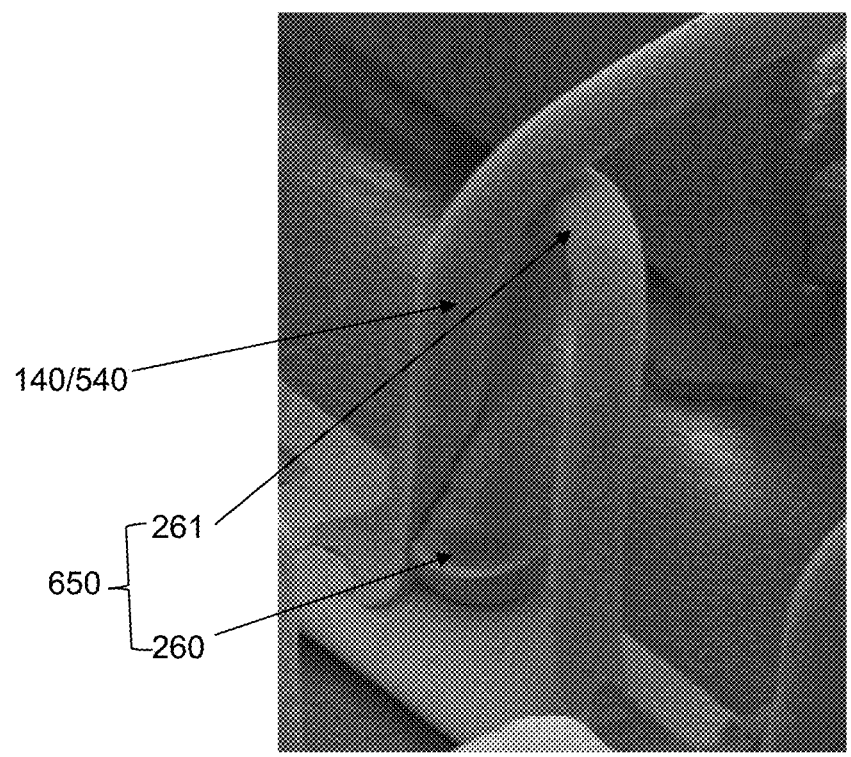
FIG. 13 is a photograph of portion 'C' of FIG. 12.

FIG. 12 illustrates a partial cross-sectional view of a semiconductor device 1000 in accordance with a further embodiment, and FIG. 13 is a captured photograph of portion 'C' of FIG. 12. Referring to FIG. 12, the semiconductor device 1000 includes the substrate 110, the semiconductor die 120, a conductive wire, such as the shielding wire 140, and an auxiliary structure, such as an auxiliary wire 650 having a bump structure portion 260 and a wire portion 261 connected to the bump structure portion 260.

In accordance with the present embodiment, the bump structure portion 260 and the wire portion 261 of auxiliary wire 650 together support the shielding wire 140 and increase an angle at which the shielding wire 140 is bonded to the second bonding pad 112. When no auxiliary wire and bump structure exist, a shielding wire may be bonded to a second bonding pad at an angle of less than approximately 45 degrees. In accordance with the present embodiment, the wire portion 261 of auxiliary wire 650 is formed under the shielding wire 140, and the bump structure portion 260 of auxiliary wire 650 and the base of the shielding wire 140 are formed adjoining each other adjacent second bonding pad 112, so that the shielding wire 140 is brought into contact with both the wire portion 261 and the bump structure portion 260. Accordingly, an angle at which the shielding wire 140 is bonded to the second bonding pad 112 is rapidly increased or is more steeply sloped. In accordance with the present embodiment, the shielding wire 140 may be bonded to the second bonding pad 112 at an angle greater than approximately 80 degrees. In other embodiments, the shielding wire 140 may be bonded to the second bonding pad and an angle in a range of approximately 70 degrees to approximately 90 degrees.

Further, in accordance with the present embodiment, as the wire portion 261 of the auxiliary wire 150 supports the shielding wire 140 with an increasing force, that is, as the thickness of the wire portion 261 of the auxiliary wire 150 becomes greater than that of the shielding wire 140, the shielding wire 140 may be bonded to the second bonding pad 112 at an angle of approximately 90 degrees. Therefore, according to the present embodiment, a distance between the semiconductor die 120 and an adjacent circuit device (e.g., the circuit device 130 illustrated in FIG. 1) can be reduced, thereby reducing the size of the semiconductor device 1000. In one embodiment, this distance is 100 microns or less.

In some embodiments, the auxiliary wire 650 including bump structure portion 260 and wire portion 261 may be made of gold (Au), silver (Ag), copper (Cu) and/or other materials as known to those skilled in the art. In addition, in some embodiments, the auxiliary wire 650 may be formed by additionally coating an insulating material on the aforementioned metal forming the auxiliary wire 650. Accordingly, the auxiliary wire 650 may be prevented from being shorted to elements provided in the semiconductor device 1000. Here, the insulating material coated on the auxiliary wire 650 may be made of, for example, one selected from the group consisting of polypropylene, polyethylene, polyimide, polycarbonate and/or other materials as known to those skilled in the art. It is understood that auxiliary wire 650 having bump structure portion 260 and wire portion 261 may be used in combination with any of the embodiments illustrated herein. For example, shielding wire 140 can instead be a conductive interconnect wire, such as conductive wire 540 having an opposite end attached to the bond pad 521 on semiconductor die 120 as further illustrated in FIG. 12. In some embodiments, bump structure 260 is attached to second bonding pad 112 and wire portion 261 is connected at one end to bump structure 260 and connected at another end to second bonding pad 112.

In forming the embodiments described herein, it was found that it is preferred to use a capillary wire bonding tool having an extended bottle neck height when forming the conductive wires, such as conductive wires 140, 340 540 at steeper angles. Among other things, this is to avoid touching the wire itself or touching adjacent circuit devices during the wire bonding process. In one embodiment, it was found that a capillary bottle neck height greater than approximately 450 microns is preferred compared to a conventional bottle neck height of approximately 250 microns.

While the semiconductor devices according to various aspects of the present disclosure have been described with reference to certain supporting embodiments, it will be understood by those skilled in the art that the present invention not be limited to the particular embodiments disclosed, but that the present invention will include all embodiments falling within the scope of the appended claims.

What is claimed is:

1. A method of manufacturing a semiconductor device, comprising:
    providing a substrate;
    mounting a semiconductor component to the substrate;
    attaching an auxiliary structure to the substrate along only one side of the semiconductor component; and
    attaching opposing ends of a first shielding wire to the substrate, wherein:
        the first shielding wire is spaced apart from the semiconductor component and extends across a major surface of the semiconductor component;
        the first shielding wire physically contacts the auxiliary structure at a location other than either of the opposing ends; and the auxiliary structure contacts the first shielding wire at a point laterally displaced from a maximum elevation of the first shielding wire.

2. The method according to claim 1, further comprising:
mounting a circuit device on the substrate and spaced apart from the semiconductor component to provide a space between the semiconductor component and the circuit device, wherein:
providing the substrate comprises providing the substrate including a first bonding pad at the one side of the semiconductor component and a second bonding pad at an opposite side of the semiconductor component;
attaching the auxiliary structure comprises attaching a first end of an auxiliary wire and an opposing second end of the auxiliary wire to the substrate within the space so that a portion of the auxiliary wire between the first end and the opposing second end is detached from the substrate; and
attaching the opposing ends of the first shielding wire comprises attaching one end of the first shielding wire to the first bonding pad and attaching an opposite end of the first shielding wire to the second bonding pad.

3. The method according to claim 1, wherein:
attaching the auxiliary structure comprises:
attaching the opposing ends of a first auxiliary wire to a first part of the substrate along the one side of the semiconductor component; and
attaching opposing ends of a second auxiliary wire to a second part of the substrate; and
attaching the opposing ends of the first shielding wire comprises physically contacting the first auxiliary wire.

4. The method according to claim 3, wherein:
attaching the opposing ends of the first shielding wire comprises physically contacting the second auxiliary wire.

5. The method according to claim 3, further comprising:
attaching a second shielding wire to the substrate such that the second shielding wire extends across the major surface of the semiconductor component, is perpendicular to the first shielding wire, and physically contacts the second auxiliary wire.

6. The method according to claim 3, wherein:
one or more of the first auxiliary wire and the second auxiliary wire has a shape of an arch.

7. The method according to claim 3, wherein:
attaching the auxiliary structure comprises overlapping the first auxiliary wire and the second auxiliary wire.

8. The method according to claim 1, wherein:
attaching the auxiliary structure comprises attaching an auxiliary wire comprising a bump structure portion and a wire portion connected to the bump structure portion;
the wire portion is detached from the substrate; and
attaching the opposing ends of the first shielding wire comprises attaching one of the opposing ends of the first shielding wire so that the first shielding wire physically contacts the bump structure portion.

9. The method according to claim 1, wherein:
attaching the opposing ends of the first shielding wire comprises contacting the auxiliary structure so that the first shielding wire forms an angle with respect to a major surface of the substrate.

10. The method according to claim 9, wherein:
the angle is in a range from 70 degrees through 90 degrees.

11. The method of claim 1, wherein:
attaching opposing ends of the first shielding wire to the substrate comprises contacting the auxiliary structure with the first shielding wire at a location other than one that overlies the semiconductor component.

12. A method of manufacturing a semiconductor device, comprising:
providing a substrate having a semiconductor component mounted to a first surface of the substrate;
connecting a first auxiliary wire adjacent to the first surface of the substrate;
connecting a second auxiliary wire adjacent to the first surface of the substrate proximate to the first auxiliary wire so that the first auxiliary wire and the second auxiliary wire cross each other in a plan view; and
connecting opposing ends of a first shielding wire adjacent to the first surface of the substrate while using the first auxiliary wire to support the first shielding wire, wherein:
the first shielding wire is spaced apart from the semiconductor component and is formed across a major surface of the semiconductor component;
the first shielding wire physically contacts the first auxiliary wire at a location other than either of the opposing ends of the first shielding wire;
the location is spaced apart from the substrate;
the location is proximate to where the first auxiliary wire and the second auxiliary wire cross each other; and
the first shielding wire physically contacts the first auxiliary wire at a point laterally displaced from a maximum elevation of the first shielding wire.

13. The method according to claim 12, wherein:
connecting the first auxiliary wire comprises connecting the first auxiliary wire comprising:
a first support portion that is perpendicular to the first surface of the substrate;
a second support portion that is spaced apart from the first support portion and formed to be inclined with respect to the first surface of the substrate; and
a third support portion connecting the first support portion and the second support portion and formed to be planar.

14. A method of manufacturing a semiconductor device, comprising:
providing a substrate;
mounting a semiconductor component to the substrate;
attaching opposing ends of a first auxiliary wire to a first part of the substrate along only one side of the semiconductor component;
attaching opposing ends of a second auxiliary wire to a second part of the substrate;
attaching opposing ends of a first shielding wire to the substrate, wherein:
the first shielding wire is spaced apart from a major surface of the semiconductor component and extends across the major surface of the semiconductor component;
the first shielding wire physically contacts the first auxiliary wire at a location other than either of the opposing ends; and
the first auxiliary wire contacts the first shielding wire at a point laterally displaced from a maximum elevation of the first shielding wire; and
attaching a second shielding wire to the substrate such that the second shielding wire extends across the major surface of the semiconductor component, is perpendicular to the first shielding wire, and physically contacts the second auxiliary wire.

15. The method according to claim 14, wherein:
attaching the second auxiliary wire comprises overlapping the first auxiliary wire and the second auxiliary wire.

16. The method according to claim 14, wherein:
one or more of the first auxiliary wire and the second auxiliary wire has a shape of an arch.

17. The method according to claim 14, wherein:
attaching the opposing ends of the first shielding wire comprises contacting the first auxiliary wire so that the first shielding wire forms an angle with respect to a major surface of the substrate.

18. The method according to claim 17, wherein:
the angle is in a range from 70 degrees through 90 degrees.

* * * * *